United States Patent [19]

Cantoni

[11] Patent Number: 4,753,682
[45] Date of Patent: Jun. 28, 1988

[54] APPARATUS OF THERMOELECTRIC EFFECT FOR CURRENT GENERATION IN INTERNAL COMBUSTION ENGINE VEHICLES AND THE LIKE, WITH RECOVERY OF THE EXTERNALLY DISSIPATED HEAT

[75] Inventor: Angelo Cantoni, Rome, Italy

[73] Assignee: Ital Idee s.r.l., Rome, Italy

[21] Appl. No.: 899,715

[22] Filed: Aug. 25, 1986

[30] Foreign Application Priority Data

Sep. 3, 1985 [IT] Italy .............................. 48515 A/85

[51] Int. Cl.[4] ........................................... H01L 35/28
[52] U.S. Cl. ..................................... 136/212; 165/42; 320/61; 322/2 R
[58] Field of Search ............... 136/203, 204, 208, 209, 136/210, 212; 165/41, 42, 43, 52; 320/61; 322/2 R

[56] References Cited

U.S. PATENT DOCUMENTS 4,218,266  8/1980  Guazzoni et al. .............. 136/212 X
4,292,579  9/1981  Constant ......................... 136/203 X
4,628,872 12/1986  Ogawa et al. ..................... 165/41 X

*Primary Examiner*—Deborah L. Kyle
*Assistant Examiner*—Brian S. Steinberger
*Attorney, Agent, or Firm*—Fleit, Jacobson, Cohn & Price

[57] ABSTRACT

The apparatus of thermoelectric effect for current generation in internal combustion engine vehicles and the like, with recovery of the externally dissipated heat, according to the present invention, comprises a thermoelectric generator provided with several Peltier effect elements undergoing heat transfer with a high-temperature fluid originating from the engine and with a cooling fluid, and possessing electrical conductors connected to their ends across which a thermoelectric e.m.f. is generated, said conductors being connected to an electrical user circuit.

7 Claims, 2 Drawing Sheets

APPARATUS OF THERMOELECTRIC EFFECT FOR CURRENT GENERATION IN INTERNAL COMBUSTION ENGINE VEHICLES AND THE LIKE, WITH RECOVERY OF THE EXTERNALLY DISSIPATED HEAT

BACKGROUND OF THE INVENTION

The present invention relates to an apparatus of thermoelectric effect for current generation in internal combustion engine vehicles and the like, with recovery of the externally dissipated heat.

The internal combustion engines of normal vehicles utilise the chemical energy of the fuel fed to them by means of a thermodynamic cycle which results in a considerable heat quantity, usually equal to about 65% of the available energy, being externally dissipated.

This heat, which is at too low a temperature for use in producing further mechanical work at satisfactory efficiency, is usually dissipated into the engine cooling system, into the lubricating oil and through the exhaust gas.

Moreover, in motor vehicles, a part of the mechanical energy produced by the internal combustion engine is used to provide the energy required by the vehicle electrical system, which can also feed accessory services such as the passenger compartment air conditioning system.

This electrical circuit is currently fed by the use of dynamos or alternators, which absorb part of the power produced by the engine and thus penalize its operation.

The problem therefore arises of recovering at least part of the heat externally emitted by the engine, so as to obtain electrical energy from it for feeding the vehicle electrical circuit and the cooling members for the air conditioning of its passenger compartment, and also conveniently for cooling the feed air of supercharged engines thus increasing their efficiency.

SUMMARY OF THE INVENTION

These results are obtained by the present invention, which provides an apparatus of thermoelectric effect for current generation in internal combustion engine vehicles and the like, with recovery of the externally dissipated heat, characterized by comprising a thermoelectric generator provided with one or more bimetallic Peltier effect elements each possessing one surface in heat transfer contact with a high-temperature fluid originating from the engine, and one surface in heat transfer contact with a cooling fluid, and possessing electrical conductors connected to the element ends across which an e.m.f. is generated by thermoelectric effect, said conductors being connected to an electrical user circuit.

According to a first embodiment, the thermoelectric generator consists of a metal heat exchanger element comprising internal ducts with connectors for connection to the engine cooling liquid circuit prior to the point in which the liquid enters the radiator, and having its walls in contact with one of the surfaces of bimetallic Peltier effect elements which are electrically connected together, their other surface being in contact with heat exchanger elements arranged for heat transfer against ambient air.

The user circuit for the electric current produced by the thermoelectric generator is conveniently the circuit for recharging the vehicle battery and for feeding the apparatus and instruments on board the vehicle, and which can also feed an air cooling apparatus.

This air cooling apparatus can cool the engine feed air, particularly in the case of supercharged engines, resulting in engine efficiency increase, or can cool the air for the air conditioning of the vehicle passenger compartment.

In greater detail, the air cooling apparatus can consist of a duct within which the air to be cooled flows, and on the walls of which there are one or more bimetallic Peltier effect elements having one surface in heat transfer contact with the air flowing within the duct and the other surface in heat transfer contact with the air flowing external to the duct, and which is possibly conveyed within an external duct coaxial to the preceding, the bimetallic Peltier effect elements being electrically connected together and fed by current produced by the thermoelectric generator, in such a manner as to cause cooling of that surface facing the interior of the duct through which the air to be cooled flows, and heating of that surface facing outwards from said duct.

According to a different embodiment of the invention, the air cooling apparatus can consist of a duct within which the air to be cooled flows and in which there is inserted a radiator traversed by a thermal carrier fluid originating from a circuit which connects the radiator to a heat exchanger, and having disposed on its walls one or more bimetallic Peltier effect elements having one surface in heat transfer contact with the thermal carrier fluid circulating through the heat exchanger and the other surface in heat transfer contact with the air flowing external to said heat exchanger, and which is possibly conveyed within a duct enclosing the heat exchanger, the bimetallic Peltier effect elements being electrically connected together and fed by current produced by the thermoelectric generator, in such a manner as to cause cooling of that surface facing the interior of the heat exchanger and heating of that surface facing outwards from said heat exchanger.

According to a further embodiment of the present invention, the thermoelectric generator can comprise one or more bimetallic Peltier effect elements disposed on the walls of a heat exchanger chamber connected to the exhaust gas discharge pipe of the vehicle engine, there being present at the chamber inlet a butterfly valve controlled by a thermostat in such a manner as to deviate part of the exhaust gas flow from said heat exchanger chamber in order to maintain the temperature in said chamber at a substantially constant value, which is conveniently chosen equal to the exhaust gas temperature when the engine is idling.

DESCRIPTION OF THE DRAWINGS

Further details will be apparent from the description given hereinafter with reference to the accompanying drawings, in which.

DETAILED DESCRIPTION

Figure 1:
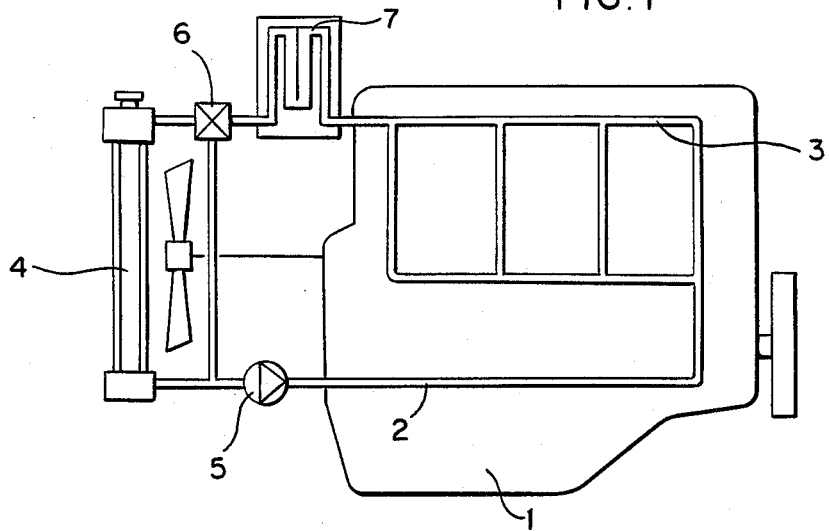
FIG. 1 is an overall diagram of the cooling circuit of an internal combustion engine provided with a thermoelectric generator unit according to the invention.

As shown in FIG. 1, an internal combustion engine 1 is provided with a cooling circuit 2 which conveys the cooling liquid from the engine cooling jacket 3 to the radiator 4 with the aid of a pump 5.

A control valve 6 maintains the cylinder head temperature constant by controlling the cooling liquid flow through the radiator.

At the outlet of the engine cooling circuit there is provided a thermoelectric generator unit 7 comprising Peltier effect elements arranged to generate an electric current by absorbing part of the thermal energy of the cooling liquid.

Figure 2:
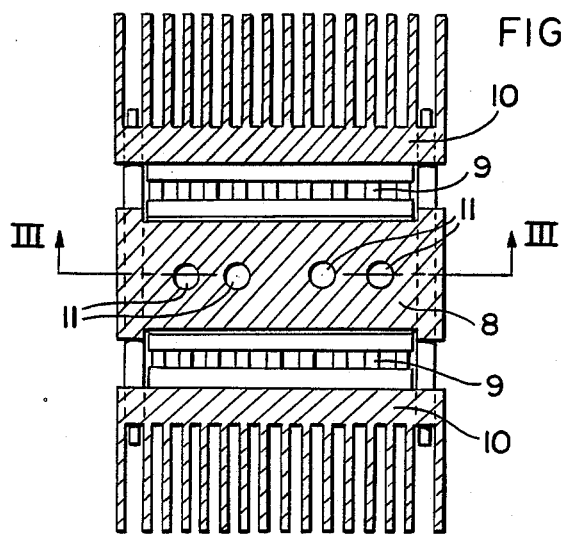
FIG. 2 is a section through the thermoelectric generator unit according to the invention on the plane II—II of FIG. 3.
Figure 3:
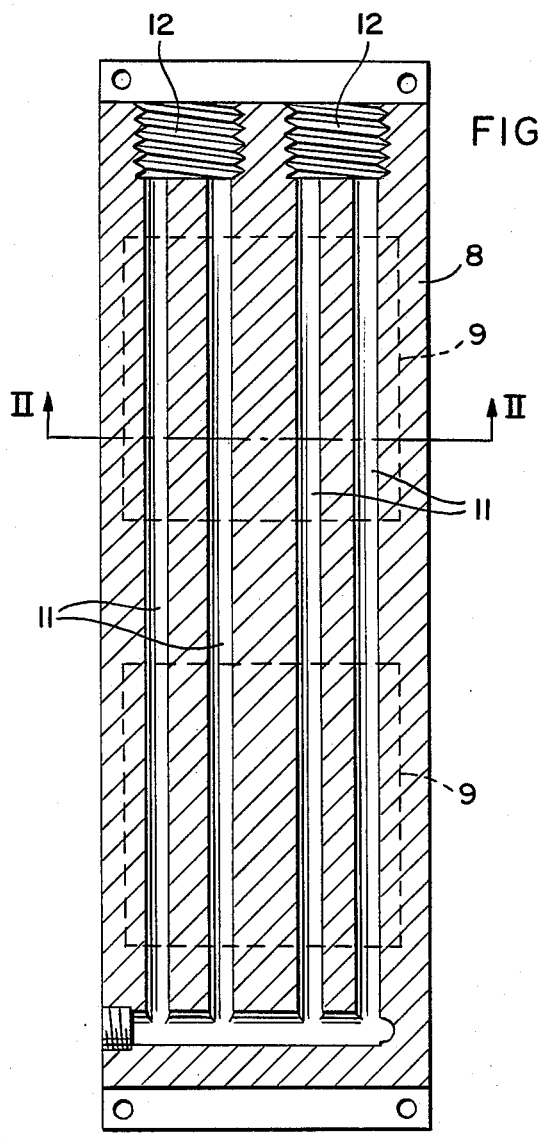
FIG. 3 is a section through the thermoelectric generator unit on the plane III—III of FIG. 2.

FIG. 2 and 3 show one embodiment of the thermoelectric generator, which comprises a metal block 8 on the sides of which there are located the Peltier effect elements 9, these being enclosed by the finned metal plates 10. Inside the metal block 8 there are fomed ducts 11, through which the cooling liquid circulates and which are connected to the engine cooling circuit by way of the threaded inlet and outlet connectors 12.

The engine cooling liquid, leaving the jacket 3 at high temperature, heats one face of the elements 9, whereas their opposite face is kept cool by the finned plates 10.

Figure 7:
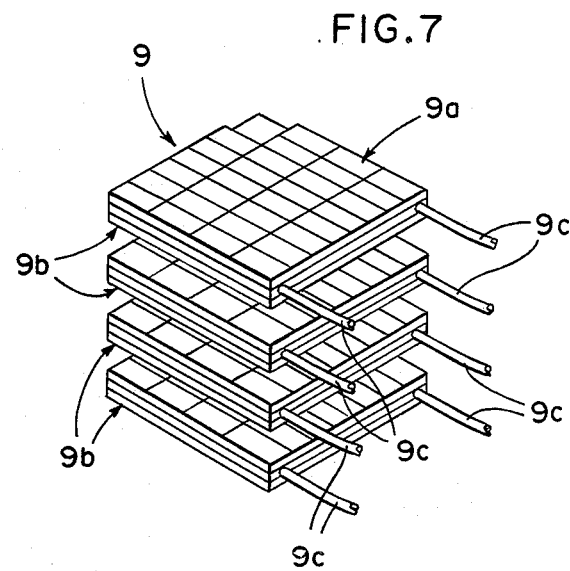
FIG. 7 is a perspective view of four thermoelectric elements.

The bimetallic Peltier effect elements are illustrated separately in FIG. 7, and comprise an upper surface 9a, a lower surface 9b and electricity feed cables 9c, through which a voltage can be applied to the element to produce cooling and heating at its surfaces 9a and 9b respectively, according to the direction of the applied voltage, whereas in contrast if a temperature difference $\Delta T$ is maintained between the surfaces 9a and 9b, an e.m.f. is generated across the electric cables 9c to produce an electric current in the circuit when this latter is closed.

By way of example, if an assembly of 120 elements connected in series-parallel is provided, it supplies a current of 28 A at 13.5 V and forms overall a plate of $50 \times 120 \times 7$ mm, having a weight of about 200 grams.

In normal internal combustion engines, the cooling liquid leaves the engine jacket at a temperature of about 95° C., but which can also reach up to 120° C. in certain applications, such as in competition engines. The temperature of external air can normally be considered to be 25° C. Thus under normal conditions, a temperature difference $\Delta T$ between the hot and cold heat transfer surfaces of the elements can be considered to be 70° C., this being sufficient to provide the Peltier effect elements with a temperature difference such as to ensure their proper operation. As these Peltier effect elements can also operate at a temperature difference $\Delta T$ of 55° C., the generator operation is ensured even under extreme environmental conditions, with an air temperature of 45° C., under which conditions the cooling liquid temperature reaches 100° C. even in normal engines, there also being no problem in the case of the said competition engines which when at full working speed operate with a much higher cooling liquid temperature.

Figure 6:
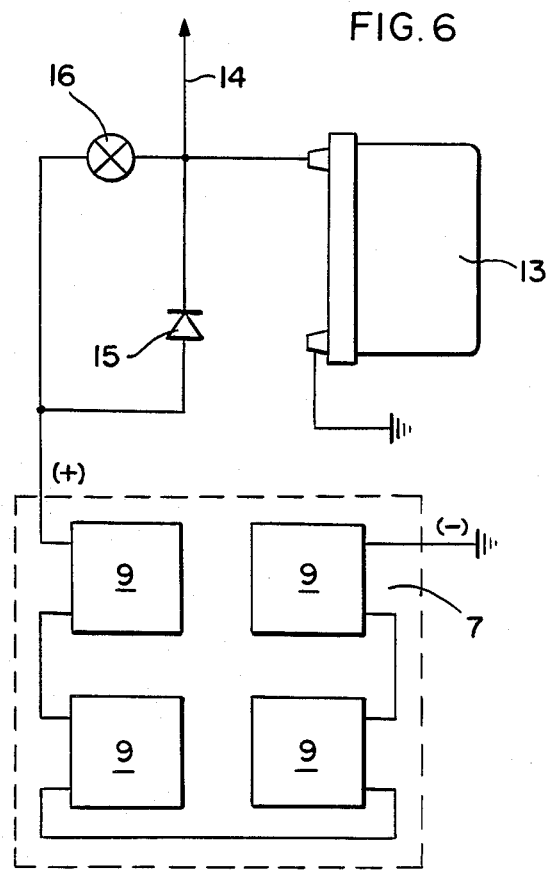
FIG. 6 is a diagrammatic representation of an electrical system for a vehicle provided with the thermoelectric generator unit according to the invention.

FIG. 6 shows the use of the generator 7 according to the invention in a vehicle electrical circuit for maintaining a battery 13 charged and feeding the apparatus and instruments on board by way of the line 14.

For this purpose the Peltier effect elements are connected in series, and the negative pole (−) of the assembly is connected to earth while the positive pole (+) is connected to the positive pole of the battery 13 by way of the diode 15. A lamp 16 disposed on the vehicle dashboard lights when the Peltier effect elements are not producing current, and is extinguished when these elements feed current to the battery.

The electric current produced by the thermoelectric generator according to the invention can be used for feeding the vehicle electrical system, by means of a circuit as heretofore described, or can be used for the air conditioning of the vehicle passenger compartment, or for cooling the combustion air.

Figure 4:
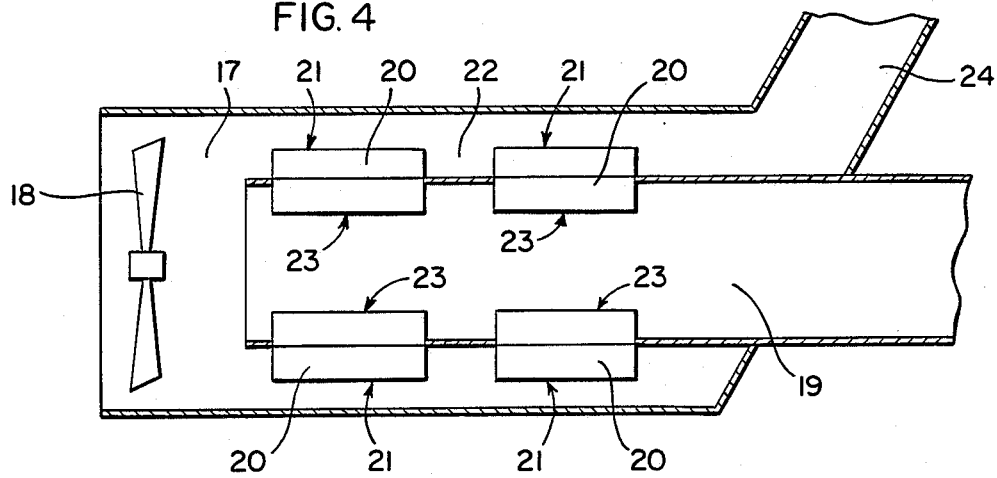
FIG. 4 is a diagrammatic sectional view of an air cooling duct according to the invention.

For this purpose, as shown in FIG. 4, in the duct 17 through which the air to be conditioned flows under the thrust of a fan 18 or the like, there is disposed a duct 19 concentric to the preceding and having disposed on its walls several bimetallic Peltier effect elements 20 having one surface 21, or hot surface, arranged for heat transfer with the air flowing in the annular portion 22 of the duct 17, external to the duct 19, and one surface 23, or cold surface, arranged for heat transfer with the air flowing through the duct 19.

When the bimetallic Peltier effect elements are fed with current, that air fraction flowing through the duct 19 is cooled by heat transfer with the surface 23 of said elements, and can therefore be fed to the required use. The air flowing in the annular portion 22 is instead heated by heat transfer with the surface 21 of the elements 20, and is discharged to atmosphere through the discharge duct 24.

Figure 5:
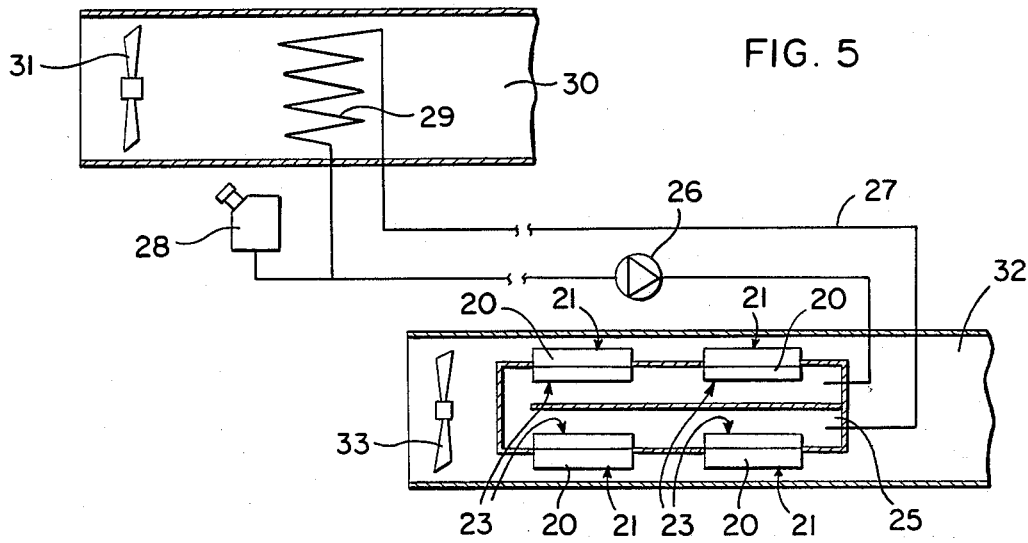
FIG. 5 shows an alternative embodiment of an air cooling circuit.

In the embodiment shown in FIG. 5, the bimetallic Peltier effect elements are disposed with their cold surfaces 23 in contact with liquid circulated by a pump 26 through a heat exchanger 25 forming part of a circuit 27 comprising a vessel 28 which allows thermal expansion, and feeding a radiator 29 disposed within the duct 30 through which air is fed to the required use, possibly by a fan 31.

The heat exchanger 25 is inserted in a duct 32 through which air is fed by a fan 33 to allow heat transfer with the outer surface of the bimetallic Peltier effect elements 20. In a like manner to the preceding embodiment, the air flowing through the duct 32 is fed to the outside of the vehicle.

In such an embodiment it is possible to locate the assembly comprising the bimetallic Peltier effect elements in a position distant from the duct feeding air to the user item and connecting them by cooling liquid circulation lines, with advantages in arranging the components inside the vehicle.

The thermoelectric generator according to the invention can also be applied to the vehicle exhaust pipe, using the exhaust gas heat for heating the bimetallic Peltier effect elements. In this embodiment, not shown in the figures, heat is given up by the exhaust gas in a chamber, the temperature of which is kept constant by a butterfly valve controlled by a thermostat and enabling the exhaust gas flow to be deviated from this heat exchanger chamber when the gas temperature exceeds a predetermined value.

The temperature at which heat transfer takes place is chosen equal to the exhaust gas temperature under engine idling conditions, so that the current and voltage provided by the thermoelectric generator remain substantially constant under all engine operating conditions.

Various modifications can be made to the practical embodiment, but without leaving the scope of the present invention in its general characteristics.

What is claimed is:

1. An apparatus of thermoelectric effect for current generation in internal combustion engine vehicles with recovery of externally dissipated heat, said apparatus comprising:

vehicle means having an internal combustion engine including an engine cooling liquid circuit, an engine cooling jacket and a radiator, said engine cooling liquid circuit for conveying a cooling liquid from said engine cooling jacket to said radiator;

thermoelectric generator, connected to said cooling circuit, having a plurality of bimetallic Peltier effect elements;

each of said plurality of bimetallic Peltier effect elements having a first surface in heat transfer contact with a high temperature fluid originating from said internal combustion engine and a second surface in heat transfer contact with said cooling liquid;

electrical conductor means connected to said plurality of bimetallic Peltier effect elements such that a thermoelectric effect between said first and second surfaces generates an e.m.f. across said electrical conductor means for producing an electric current in said thermoelectric generator; and electrical user circuit connected to said electrical conductor means for receiving said electric current produced in said thermoelectric generator and providing said electric current to said apparatus for charging a battery means and a air cooling means.

2. An apparatus according to claim 1 wherein said thermoelectric generator further comprises a metal heat exchanger element means including internal ducts with connectors for connecting said metal heat exchanger between the engine cooling liquid circuit and the radiator, and said internal ducts having a wall in contact with one surface of said plurality of bimetallic Peltier effect elements which are electrically connected together, said other surface of said plurality of Peltier effect element being in contact with said metal heat exchanger element means which are arranged for heat transfer against ambient air.

3. An apparatus according to claim 1, wherein said thermoelectric generator comprises a heat exchanger chamber having one or more bimetallic Peltier effect elements disposed on the walls of said chamber connected to a discharge duct of said engine, said chamber having a thermostat to maintain the temperature in said chamber at a substantially constant value.

4. An apparatus according to claim 1 wherein said air cooling means provides cooling of engine feed air, such that engine efficiency increases.

5. An apparatus according to claim 1, wherein said air cooling means provides cooling of the air for air conditioning of the vehicle.

6. An apparatus according to claim 4 or 5, wherein said air cooling apparatus further comprising a duct within which air to be cooled flows, and on the walls of said duct are said plurality of bimetallic Peltier effect elements having one of said surfaces in heat transfer contact with air flowing within the duct and said other surface in heat transfer contact with air flowing external to the duct, and said external air being conveyed within an external duct coaxial to said duct, said plurality of bimetallic Peltier effect elements being electrically connected together and fed by said electric current produced by the thermoelectric generator, in such a manner as to cause cooling of said surface facing the interior of the duct through which the air to be cooled flows, and to cause heating of said other surface facing outwards from said duct.

7. An apparatus according to claim 4 or 5 wherein said air cooling means comprises a duct within which air to be cooled flows and said radiator which is traversed by a thermal carrier fluid originating from a circuit which connects the radiator to a heat exchanger, and said duct having disposed on its walls said plurality of several bimetallic Peltier effect elements each having one of said surfaces in heat transfer contact with the thermal carrier fluid circulating through the heat exchanger and said other surface in heat transfer contact with air flowing external to said heat exchanger, and said external air being conveyed within a duct enclosing the heat exchanger, the bimetallic Peltier effect elements which are electrically connected together and fed by said electric current produced by the thermoelectric generator, in such a manner as to cause cooling of said one surface facing the interior of the heat exchanger and to cause heating of said other surface facing outwards from said heat exchanger.

* * * * *